(12) United States Patent
Hu et al.

(10) Patent No.: US 9,034,767 B1
(45) Date of Patent: May 19, 2015

(54) FACILITATING MASK PATTERN FORMATION

(71) Applicant: GLOBALFOUNDRIES Inc., Grand Cayman (KY)

(72) Inventors: Xiang Hu, Clifton Park, NY (US); Dae-Han Choi, Loudonville, NY (US); Dae Geun Yang, Watervliet, NY (US); Taejoon Han, Clifton Park, NY (US); Andy Wei, Queensbury, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/076,386

(22) Filed: Nov. 11, 2013

(51) Int. Cl.
*H01L 21/311* (2006.01)
*H01L 21/30* (2006.01)
*H01L 21/308* (2006.01)

(52) U.S. Cl.
CPC .................. *H01L 21/3086* (2013.01)

(58) Field of Classification Search
USPC ................................................ 438/689–697
See application file for complete search history.

(56) References Cited

U.S. PATENT DOCUMENTS

2012/0156883 A1* 6/2012 Choi .............................. 438/703

* cited by examiner

*Primary Examiner* — Mamadou Diallo
(74) *Attorney, Agent, or Firm* — Kevin P. Radigan, Esq.; Heslin Rothenberg Farley & Mesiti P.C.

(57) ABSTRACT

Mask pattern formation is facilitated by: providing a mask structure including at least one sacrificial spacing structure disposed above a substrate structure; disposing a spacer layer conformally over the mask structure; selectively removing the spacer layer, leaving, at least in part, sidewall spacers along sidewalls of the at least one sacrificial spacing structure, and providing at least one additional sacrificial spacer over the substrate structure, one additional sacrificial spacer of the at least one additional sacrificial spacer being disposed in set spaced relation to the at least one sacrificial spacing structure; and removing the at least one sacrificial spacing structure, leaving the sidewall spacers and the at least one additional sacrificial spacer over the substrate structure as part of a mask pattern.

20 Claims, 5 Drawing Sheets

FIG. 2H ated on a wafer using a lithography process. The lithography process may include, for instance, forming a mask pattern above a substrate structure, and etching the substrate structure using the mask pattern. Recent advances in lithographic processing techniques, such as, for example, self-aligned double patterning (SADP) or self-aligned quadruple patterning (SAQP) techniques, have been employed to form mask patterns over a substrate structure at a reduced pitch, without the need for expensive lithography tools.

US 9,034,767 B1

FACILITATING MASK PATTERN FORMATION

FIELD OF THE INVENTION

The present invention relates to semiconductor devices and to methods of fabricating semiconductor devices, and more particularly, to methods for facilitating formation of mask patterns for use, for instance, in fabricating one or more semiconductor devices.

BACKGROUND OF THE INVENTION

Circuit feature fabrication, such as semiconductor device fabrication, typically involves the process of transferring a mask pattern to a wafer with subsequent etching to remove unwanted material, for instance, to facilitate forming circuit features; such as, to facilitate forming fin structures and/or gate structures of fin-type field-effect transistors (FINFETs) or to facilitate forming field-effect transistors (FETs) in general. This process is generally referred to as lithography processing. As the size of technology nodes continues to decrease, significant challenges continue to arise due (in part) to issues related to process limitations of traditional lithographic processing techniques, including issues related to mask pattern formation over the wafer.

BRIEF SUMMARY

The shortcomings of the prior art are overcome and additional advantages are provided through the provision, in one aspect, of a method which includes, for instance: providing a mask structure including at least one sacrificial spacing structure disposed above a substrate structure; disposing a spacer layer conformally over the mask structure; selectively removing the spacer layer, leaving, at least in part, sidewall spacers along sidewalls of the at least one sacrificial spacing structure, and providing at least one additional sacrificial spacer over the substrate structure, one additional sacrificial spacer of the at least one additional sacrificial spacer being disposed in set spaced relation to at least one sacrificial spacing structure; and removing the at least one sacrificial spacing structure, leaving the sidewall spacers thereof and the at least one additional sacrificial spacer over the substrate structure as part of a mask pattern.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that in making reference below to the drawings (which are not drawn to scale for ease of understanding) the same reference numbers used throughout different figures designate the same or similar components.

In fabricating integrated circuits (ICs) or semiconductor devices, the density of components continues to increase to achieve greater functionality and reduced manufacturing costs. This increase in density of components has led to a continued shrinking of circuit dimensions and component features, resulting in significant challenges to existing lithographic processing techniques.

One aspect of integrated circuit fabrication (also referred to as herein semiconductor device fabrication) typically involves using lithography processing to facilitate transferring a mask pattern onto, for instance, a semiconductor wafer, and thereby facilitate etching the wafer using the transferred pattern to remove unwanted material. Lithography and etch processes may be used, for instance, to facilitate forming circuit features such as fin structures and/or gate structures. In one example, fin structures or gate structures may be fabricated using a self-aligned double patterning (SADP) process (also referred to as sidewall image transfer (SIT) processing).

By way of example, in a conventional self-aligned double patterning process, sidewall spacers created along the sidewalls of sacrificial spacing structures are used as a mask pattern during etching of the underlying structure to facilitate forming, for example, fin structures and/or gate structures. This lithography processing technique is referred to as self-aligned double patterning due to the doubling of the number of lined structures (i.e., by providing sidewall structures) along the sacrificial spacing structures. Although traditional lithographic techniques, such as self-aligned double patterning (SADP), have been adequate for circuits fabricated to date, creating ever denser lined structures using such processes is becoming difficult.

By way of further explanation, FIGS. 1A-1E depict one embodiment of the self-aligned double patterning process for fabricating a double patterned lithography mask for use, for instance, in fabricating one or more semiconductor devices.

Figure 1A:
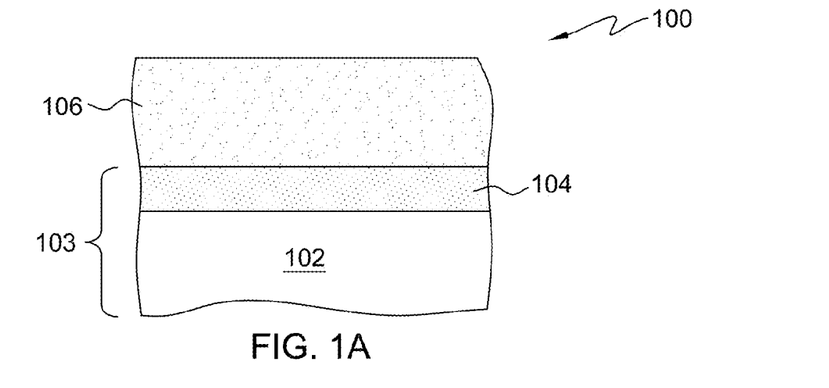
FIGS. 1A-1F depict one example of a self-aligned double patterning process for fabricating a mask pattern for use, for instance, in fabricating one or more semiconductor devices.

One embodiment of an intermediate process structure 100 is depicted in FIG. 1A. This structure 100 includes a substrate 102, such as semiconductor substrate (for instance, a silicon substrate), and multiple layers disposed over substrate 102. The multiple layers may include, for instance, a protective substrate layer 104, and a sacrificial spacing layer 106 disposed over protective substrate layer 104. In one embodiment, sacrificial spacing layer 106 is a sacrificial spacing material, such as amorphous silicon or polycrystalline silicon, which as understood in the art may be employed to hold positions or form spacing for the mask pattern being formed. The noted layers of structure 100 of FIG. 1A may be formed using a variety of different materials and fabrication techniques, such as chemical vapor deposition (CVD), physical vapor deposition (PVD) or plasma-enhanced versions of such processes. The thickness of the depicted layers may also vary, depending on the particular application.

By way of further example, substrate 102 may be any silicon-containing substrate including, but not limited to, a substrate fabrication of or including silicon (Si), single crystal silicon, polycrystalline Si, amorphous silicon, silicon-on-nothing (SON), silicon-on-replacement insulator (SRI) or the like. Protective substrate layer 104 may be or may include one or more protective substrate layer(s) disposed over substrate 102. In this example, protective substrate layer 104 may be a layer of silicon nitride, formed over a silicon substrate 102. Protective substrate layer 104 and silicon substrate 102, together define one example of a substrate structure 103.

Figure 1B:
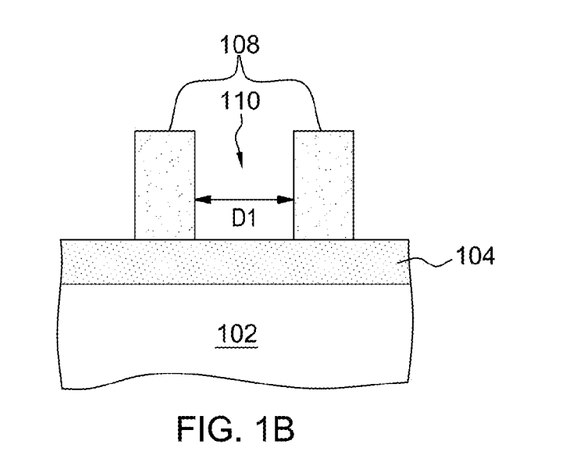

As depicted in FIG. 1B, one or more lithographic processing steps may be performed to create sacrificial spacing structures 108 from the multi-layer structure of FIG. 1A. Although not depicted, one skilled in the art will understand that these lithographic processing steps may include (for instance) providing an anti-reflective coating layer over sacrificial spacing layer 108, and providing a patterned photoresist over anti-reflective coating layer. A patterning process may proceed through the layers to transfer the pattern from the patterned photoresist layer to etch through sacrificial spacing layer 106, and thereby create the sacrificial spacing structures 108. The one or more process operations may include, for example, an anti-reflective coating open step and a hard-mask open step. A final etch step is performed to remove the patterned photoresist layer and the anti-reflective coating layers, leaving a desired pattern of sacrificial spacing structures 108. Together sacrificial spacing structures 108 disposed over substrate structure 103, and separated by spaces 110, define one example of a mask structure. Note that, in one example, the distance "D1" between two adjacent sacrificial spacing structures 108 may be in the range of about 20 nanometers to about 70 nanometers.

Figure 1C:
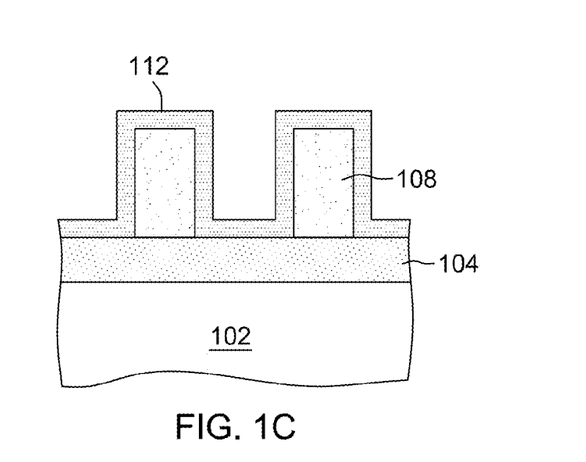

As depicted in FIG. 1C, a spacer layer 112 is conformally provided over the mask structure, including sacrificial spacing structures 108. Spacer layer 112 may include or be fabricated of a nitride material (such as, for example, $Si_3N_4$ or SiN) and may be conformally deposited using a variety of techniques such as, for example, chemical vapor deposition (CVD) or atomic layer deposition (ALD).

Figure 1D:
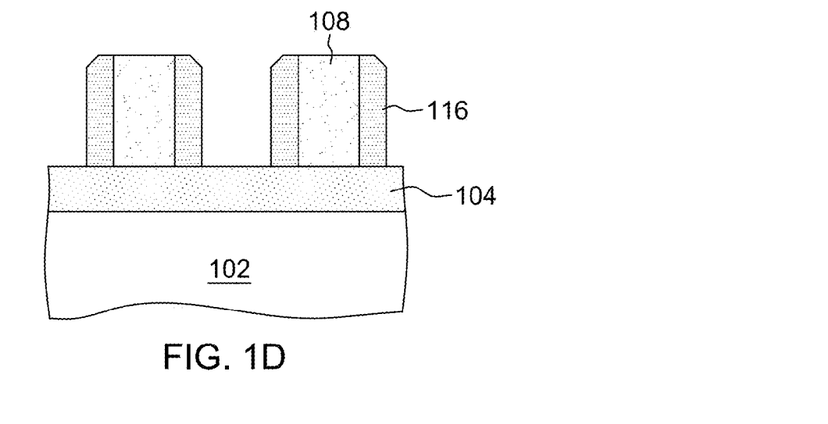

As illustrated in FIG. 1D, spacer layer 112 is etched, for instance, using any appropriate non-selective etching process to form sidewall spacers 116, along the sidewalls of sacrificial spacing structures 108. In one example, spacer layer 112 (see FIG. 1C) is selectively etched using conventional isotropic or anisotropic dry etching process such as, reactive ion etching or plasma etching. Note that spacer layer 112 (see FIG. 1C) may be selectively removed from above protective substrate layer 104, between sacrificial spacing structures 108, resulting in exposing underlying protective substrate layer 104.

Figure 1E:
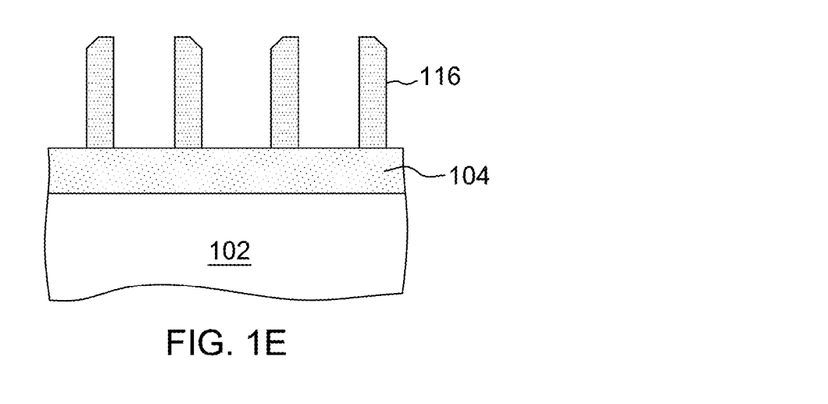
Figure 1F:
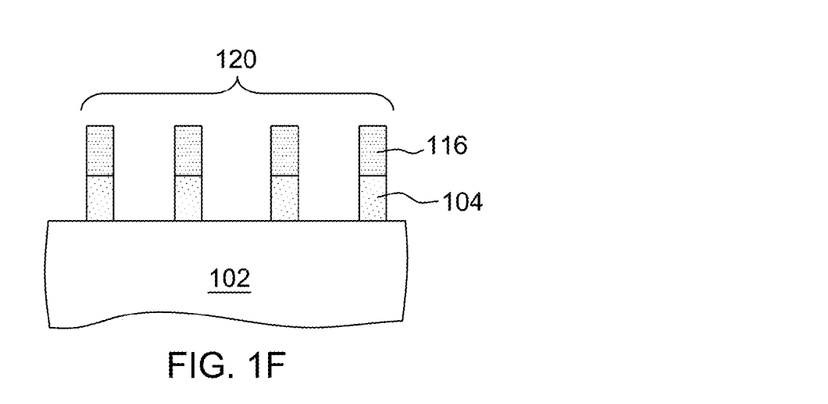

Sacrificial spacing structures 108 (see FIG. 1B) are etched, as depicted in FIG. 1E, by a selective etching processing to leave only sidewall spacers 116 above the substrate structure. The selective etch process may be one or more anisotropic, dry etch processes such as, for example, oxygen strip or plasma etching processing. In a further implementation, as illustrate in FIG. 1F, protective substrate layer 104 may be patterned using sidewall spacers 116, to create a mask pattern 120. Mask pattern 120 may then be used in patterning the underlying semiconductor substrate, for instance, to provide one or more fin structures in or extending from substrate 102. Note that evenly spaced fin structures with substantially similar dimensions are expected and desired, following the above described self-aligned double patterning process.

As an enhancement on the above-described process, disclosed herein is a method of fabricating a mask pattern, referred to herein as a triple or multiple patterned mask, for use, for instance, in fabricating one or more semiconductor devices. The method may include, for instance, providing an intermediate mask structure including at least one sacrificial spacing structure disposed above a substrate structure; disposing a spacer layer conformally over the mask structure; selectively removing the spacer layer, leaving, at least in part, sidewall spacers along sidewalls of the at least one sacrificial spacing structures, and at the same time providing at least one additional sacrificial spacer over the substrate structure, one additional sacrificial spacer of the at least one additional sacrificial spacer being disposed in spaced relation to and adjacent to the at least one sacrificial spacing structure; and removing the at least one sacrificial spacing structure, leaving the sidewall spacers thereof and the at least one additional sacrificial spacer over the substrate structure as or as a part of, a mask pattern.

In one embodiment, the remaining sidewall spacers are spaced apart a set distance and the additional sacrificial spacer is spaced approximately the same set distance from one sidewall spacer of the remaining sidewall spacers. In another embodiment, the providing includes providing a sacrificial spacing material above the substrate structure, and selectively etching through the sacrificial spacing material to provide the at least one sacrificial spacing structure disposed above the substrate structure. By way of example, the selectively etching through the sacrificial spacing material provides a first mask pattern over the sacrificial spacing material, and the first mask pattern is patterned to facilitate providing the at least one additional sacrificial spacer, for instance, including the one additional sacrificial spacer disposed in defined spaced relation and adjacent to the at least one sacrificial spacing structure. The mask structure may further include an anti-reflective coating layer, for example, a bottom anti-reflective coating layer, over the sacrificial spacing material, the anti-reflective coating facilitating, for instance, providing of the first mask pattern. Selectively removing the spacer layer may further include providing a second mask pattern above the spacer layer, the second mask pattern masking at least one location for the at least one additional sacrificial spacer, and the selectively removing includes using the second mask pattern in providing the at least one additional sacrificial spacer, at least in part, from the spacer layer. The selectively removing the spacer layer further includes providing an anti-reflective coating layer, for instance, a bottom anti-reflective coating layer, above the spacer layer. This anti-reflective coating facilitates providing the second mask pattern. In one embodiment, the sacrificial spacing material includes, for instance, a material that is selective to both an oxide etching process and a nitride etching process. For example, the sacrificial spacing material may include or be fabricated of (at least in part) at least one of amorphous silicon or polysilicon.

Further, in one embodiment, selectively removing the spacer layer may include selectively anisotropically etching, at least in part, the spacer layer, where the selectively anisotropically etching includes removing, at least in part, the spacer layer from between at least one sidewall spacer of the at least one sacrificial spacing structure and the one additional sacrificial spacer disposed in set spaced relation thereto. In one example, the sidewall spacers and the one additional sacrificial spacer of the at least one additional sacrificial spacer each include a common width, for example, of about 5 nanometers to about 30 nanometers and the sidewall spacers are spaced apart a distance "d", and the one additional sacrificial spacer is spaced the distance "d" from one sidewall spacer of the sidewall spacers. In one example, the spacer layer includes a nitride material.

In one implementation, the substrate structure includes a semiconductor substrate with at least one protective substrate layer over the semiconductor substrate, where the mask pattern facilitates patterned etching of the at least one protective substrate layer, and the patterned etching facilitates forming, for instance, fins extending from the semiconductor substrate. In one example, the semiconductor substrate includes silicon, the at least one protective substrate layer includes silicon nitride and the spacer layer includes a nitride material. Note that, in one embodiment, the substrate structure includes a first protective substrate layer above the semiconductor substrate, and optimally, a second protective substrate layer above the first protective substrate layer, and further the mask pattern may facilitate patterned etching of the first and second protective substrate layer, the patterned etching facilitating forming fins extending from the semiconductor substrate. In a specific example, the first protective substrate layer includes silicon nitride and the second protective material includes silicon dioxide.

In another implementation, the mask structure includes at least two sacrificial spacing structures disposed above the substrate structure, where the at least two sacrificial spacing structures include the at least one sacrificial spacing structure. By way of example, the selectively removing provides the one additional sacrificial spacer disposed between two adjacent sacrificial spacing structures of the at least two sacrificial spacing structures. In one embodiment, the providing includes laterally spacing apart the two adjacent sacrificial spacing structures at a distance which facilitates subsequently providing the one additional sacrificial spacer between the two adjacent sacrificial spacing structures. In one example, sidewall spacers of each sacrificial spacing structure of the two adjacent sacrificial spacing structures are spaced apart a distance "d", and the one additional sacrificial spacer is spaced the distance "d" between two different sidewalls of the two adjacent sacrificial spacing structures. In addition, sidewall spacers of the two adjacent sacrificial spacing structures and the one additional sacrificial spacing structure may each include a common width "W", for example, in a range of about 5 to 30 nanometers.

By way of example, FIGS. 2A-2H depict one detailed embodiment of a method of fabricating a mask pattern, referred to herein as a triple mask or multiple patterned mask, which may be used in fabricating of one or more semiconductor devices, in accordance with one or more aspects of the present invention.

Figure 2A:
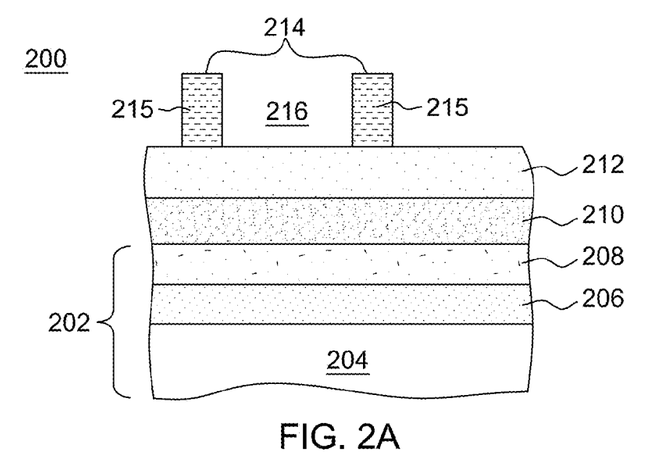
FIG. 2A is a cross-sectional elevational view of one embodiment of an intermediate structure, including a first mask pattern disposed above a substrate structure, obtained during fabrication of a mask pattern, in accordance with one or more aspects of the present invention.

FIG. 2A illustrates an intermediate mask structure 200, attained during fabrication of one or more masks, which includes, by way of example, a substrate structure 202. Substrate structure 202 includes, for instance, a semiconductor substrate 204, and one or more protective substrate layers (with two protective layers 206, 208 being illustrated in this example) disposed over semiconductor substrate 204.

In one embodiment, semiconductor substrate 204 may be a bulk semiconductor material such as, for example, a bulk silicon wafer. In another embodiment, semiconductor substrate 204 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate 204 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

As noted, and as one example only, the one or more protective substrate layers may include first protective substrate layer 206 disposed over semiconductor substrate 204 and second protective substrate layer 208 disposed over first protective substrate layer 206. First protective substrate layer 206, which may be deposited using conventional deposition processes such as chemical vapor deposition (CVD), physical vapor deposition (PVD) or atomic layer deposition (ALD), may be provided to protect semiconductor substrate 204 from damage during subsequent etching processes, and depending on the fabrication process, may also prevent semiconductive substrate 204 from being oxidized by exposure to any oxygen-containing environment. In one specific example, first protective substrate layer 206 may include a nitride material, such as silicon nitride ($Si_3N_4$ or SiN), or silicon oxynitride (SiN). In one embodiment, a first protective substrate layer 206 may have a thickness suitable to act as an etch stop layer to protect semiconductor substrate 204 from damage, however the thickness of first protective substrate layer 206 may vary according to the processing node in which the semiconductor device is being fabricated. In one example, first protective substrate layer 206 may be about 5 nanometers to about 60 nanometers.

First protective substrate layer 206 may itself be protected by second protective substrate layer 208, which may be formed of a variety of materials. By way of specific example, second protective substrate layer 208 may be a layer of oxide material such as, for example, silicon dioxide ($SiO_2$) having a thickness of about 10 nanometers to 60 nanometers, and may be formed via a chemical-vapor deposition process.

Mask structure 200 further includes a sacrificial spacing layer 210 provided over substrate structure 202. This sacrificial spacing layer 210 may be provided using, for instance, any conventional deposition processes such as, atomic layer deposition (ALD), chemical vapor deposition (CVD), physical vapor deposition (PVD) or the like. In one example, sacrificial spacing layer may be or include a sacrificial spacing material, such as amorphous silicon or polycrystalline silicon, and is used in a mask pattern formation process as described herein. Note that, in one embodiment, the sacrificial spacing material is a material that is selective to both an oxide etching process and a nitride etching process.

Figure 2B:
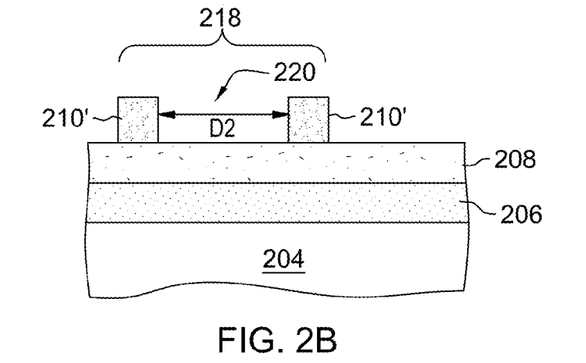
FIG. 2B depicts the structure of FIG. 2A, after etching thereof to define a mask structure, including sacrificial spacing structures disposed over the substrate structure, in accordance with one or more aspects of the present invention.

One or more lithographic processing steps may be performed to etch through sacrificial spacing layer 210 and create one or more sacrificial spacing structures 210' (see FIG. 2B). These processing steps may utilize, for instance, a first lithographic stack in which, an anti-reflective coating layer 212 is disposed over sacrificial spacing layer 210 and a first mask pattern 214 is disposed over anti-reflective coating layer 212. Note that, in one embodiment, first mask pattern 214 includes patterned photoresist elements 215 and openings 216.

Anti-reflective coating layer 212 may be, for instance, a bottom anti-reflective coating (BARC) layer deposited over sacrificial spacing layer 210, which is provided to minimize pattern distortion due to reflections and to facilitate providing first mask pattern 214. In one example, anti-reflective coating layer 212 includes conventional inorganic coating materials such as titanium, titanium dioxide, titanium nitride, chromium oxide, carbon or α-silicon. In another example, anti-reflective coating layer 212 may include a conventional organic coating material, such as a light-absorbent material, or a polymer material or combinations thereof. First mask pattern 214 may include or be fabricated of a conventional photoresist material. As is known, the photoresist protects underlying layers in the direction of etching during the etch processing, while the etching proceeds through openings 216. First mask pattern 214 may include, for instance, an organic photoresist material, a non-organic material, or any combination thereof.

One or more lithographic processes are performed to transfer the pattern from first mask pattern 214 to sacrificial spacing layer 210. By way of example, these one or more processes may include an anti-reflective-coating open step and a hard-mask open step. A final etch step is performed to obtain, for instance, the structure depicted in FIG. 2B, in which the first mask pattern and anti-reflective coating layer of FIG. 2A have been removed, leaving a desired mask pattern 218 of one or more sacrificial spacing structures 210'. Note that at least two adjacent sacrificial spacing structures of one or more sacrificial spacing structures 210' are laterally spaced 220 at a set distance D2. As one skilled in art will understand, photoresist elements 215 (see FIG. 2A) and openings 216 (see FIG. 2A), within the first mask pattern are sized and configured in this approach, to be at a set distance to advantageously facilitate creating the desired sacrificial spacing structures 210' and the desired laterally spacing by distance D2. In one specific example, distance "D2" between two adjacent sacrificial spacing structures may be in the range of about 10 to 70 nanometers.

Figure 2C:
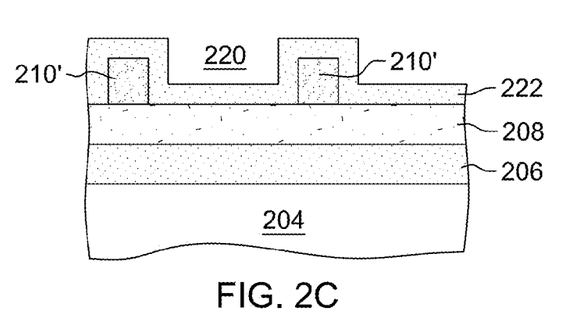
FIG. 2C depicts the mask structure of FIG. 2B, with a spacer layer conformally provided over the mask structure, in accordance with one or more aspects of the present invention.

As depicted in FIG. 2C, a spacer layer 222 is conformally provided over the mask structure, including sacrificial spacing structures 210'. Spacer layer 222 may include or be fabricated of a nitride material such as, for example, silicon nitride ($Si_3N_4$ or SiN), and may be conformally deposited using a variety of conventional deposition processes, such as, chemical vapor deposition (CVD) or atomic layer deposition (ALD). In one specific example, silicon nitride may be deposited using process gases such as, for example, dichlorosilane ($SiH_2Cl_2$) and ammonia ($NH_3$) and known process conditions. In another example, silicon nitride may also or alternatively be deposited using halogen-free precursor such as, for example, bis(t-butylamino)silane (BTBAS) ($SiC_8N_2H_{22}$) and ammonia ($NH_3$) at about 550° C. The thickness of spacer layer 222 may be about 5 to 30 nanometers, depending on the processing node in which the integrated circuit or semiconductor device is being fabricated.

Figure 2D:
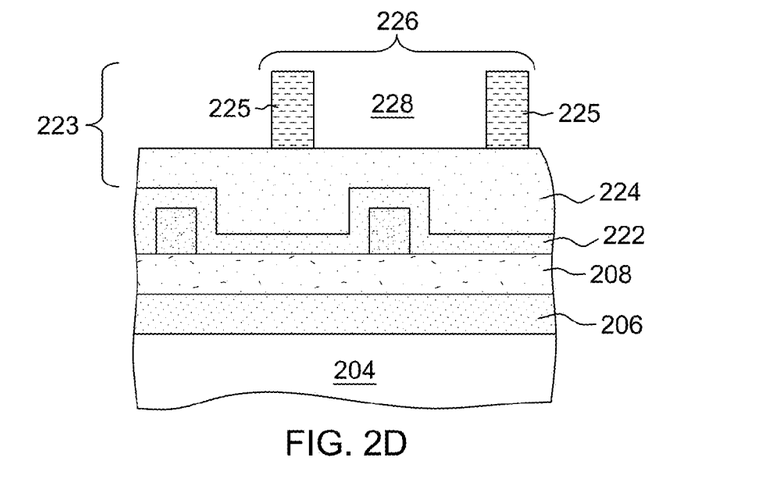
FIG. 2D is a cross-sectional elevational view of the mask structure of FIG. 2C, after conformal deposition of a second mask pattern above the spacer layer, in accordance with one or more aspects of the present invention.

One or more lithographic processing steps may subsequently be performed to etch through spacer layer 222 and create sidewall spacers along the sidewalls of one or more sacrificial spacing structure(s) 210', and advantageously, an additional sacrificial spacer between the two adjacent sacrificial spacing structures. As shown in FIG. 2D, these processing steps may include providing, for instance, a second lithographic stack 223 in which, an anti-reflective coating layer 224 is disposed above spacer layer 222 and a second mask pattern 226 is provided above anti-reflective coating layer 224. In one embodiment, second mask pattern 226 includes patterned photoresist element 225 and openings 228.

Anti-reflective coating layer 224 may be, for instance, a bottom anti-reflective coating (BARC) layer deposited over spacer layer 222, which is provided to minimize any pattern distortion due to reflections and to facilitate providing second mask pattern 226. In one example, anti-reflective coating layer 224 includes conventional inorganic coating materials such as titanium, titanium dioxide, titanium nitride, chromium oxide, carbon or α-silicon. In another example, anti-reflective coating layer 224 may include a conventional organic coating material, such as a light-absorbent material, or a polymer material or combinations thereof. Second mask pattern 226 may include or be fabricated of a conventional photoresist material. As is known, the photoresist protects underlying layers in the direction of etching during etch processing, while etching proceeds through opening 228. Second mask pattern 226 may include, for instance, an organic photoresist material, a non-organic material, or any combination thereof.

Figure 2E:
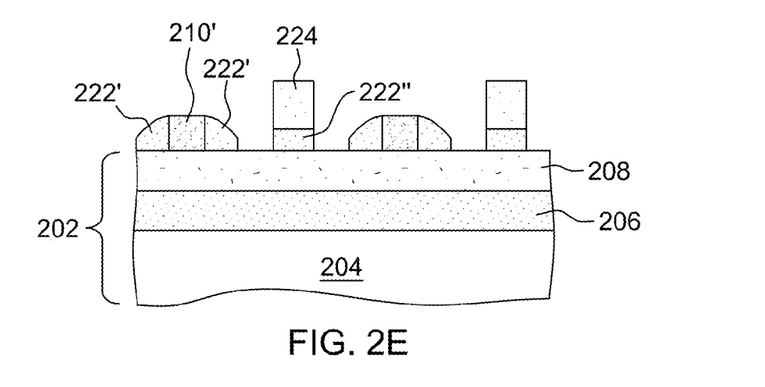
FIG. 2E depicts the mask structure of FIG. 2D after selective removal, at least in part, of the spacer layer, and leaving sidewall spacers along the sidewalls of the sacrificial spacing structures and additional sacrificial spacers between the sacrificial spacing structures, in accordance with one or more aspects of the present invention.

One or more lithographic processes are performed to transfer the pattern from second mask pattern 226 to spacer layer 222, with the resultant structure being depicted in FIG. 2E. As shown, the resultant structure includes sidewall spacers 222' along the sidewalls of sacrificial spacing structures 210' and one or more additional sacrificial spacer 222" between respective adjacent sacrificial spacing structures 210'. This structure may be defined using, for instance, a two-step etch process which includes an anti-reflective-coating open step and a hard-mask open step. In one example, the anti-reflective coating open step may be performed using a variety of conventional etch processes including wet etch, dry etch, plasma etching, reactive ion etching, or a combination thereof. Note that a portion of anti-reflective coating layer 224 remains over a portion of spacer layer 222, which defines the one or more additional sacrificial spacer 222". These additional sacrificial spacers 222" are disposed at a defined or set position in spaced relation and adjacent to respective sacrificial spacing structures 210'.

Spacer layer 222 (FIG. 2D) may be etched using, for instance, any appropriate selective etching process(es) such as, for example, hard-mask open (HMO) step, to create sidewall spacers 222' along the sidewalls of sacrificial spacing structures 210' and simultaneously create additional sacrificial spacers 222" between (in one embodiment) respective adjacent sacrificial spacing structures 210'. Second mask pattern 226, with mask elements 225 and openings 228 facilitates masking at least one location within spacer layer 222, which facilitates fabricating at least one additional sacrificial spacer 222". In one embodiment, spacer layer 222 (see FIG. 2D) may be anisotropically removed from above substrate structure 202, between the sidewall spacers of the one or more sacrificial spacing structure and the additional sacrificial spacers 222" disposed in set spaced relation to sacrificial spacing structures 210' to, for example, expose a portion of substrate structure 202. Note that spacer layer 222 (see FIG. 2D) is (in one embodiment) removed from above one or more sacrificial spacing structures 210' to expose the sacrificial spacing structures, while leaving sidewall spacers 222' along the sidewalls of sacrificial spacing structures 210'. The spacer layer may be selectively etched using isotropic or anisotropic dry etching processing such as, reactive ion etching or plasma etching. In one specific example, reactive ion etching may be performed using remote plasma involving process gases such as nitrogen trifluoride ($NF_3$) and hydrogen ($H_2$). In another example, a directional anisotropic dry etching step such as, for example, reactive ion etching (RIE) may be performed using fluorine based chemistry and involving gases such as tetrafluoromethane ($CF_4$), trifluoromethane ($CH_3F$), difluoromethane ($CH_2F_2$), fluoromethane ($CH_3F$), octofluoromethane (C4F8), hexafluoro-1,3-butadiene ($C_4F_6$), sulfur hexafluoride ($SF_6$) and oxygen ($O_2$).

Figure 2F:
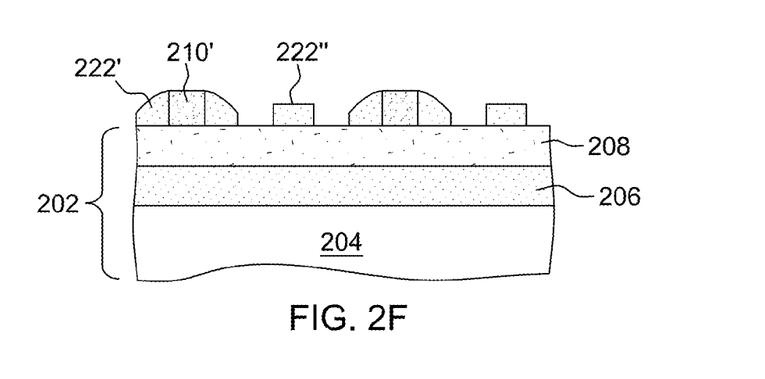
FIG. 2F depicts the mask structure of FIG. 2E after removal of remaining anti-reflective coating material to expose the additional sacrificial spacers, in accordance with one or more aspects of the present invention.

As illustrated in FIG. 2F, the remaining portion of anti-reflective coating material/layer 224 (FIG. 2E) may be polished away using, for instance, a non-selective chemical mechanical polish or an etch back polish, with additional sacrificial spacer 222" being the etch stop. In another specific example, the remaining portion of anti-reflective coating material/layer 224 (FIG. 2E) may be removed using, for instance, an oxygen ($O_2$) ashing process. Note that the mask structure of FIG. 2F includes sidewall spacers 222' along the sidewalls of sacrificial spacing structures 210' and additional sacrificial spacer 222" between adjacent respective sacrificial spacing structures.

Figure 2G:
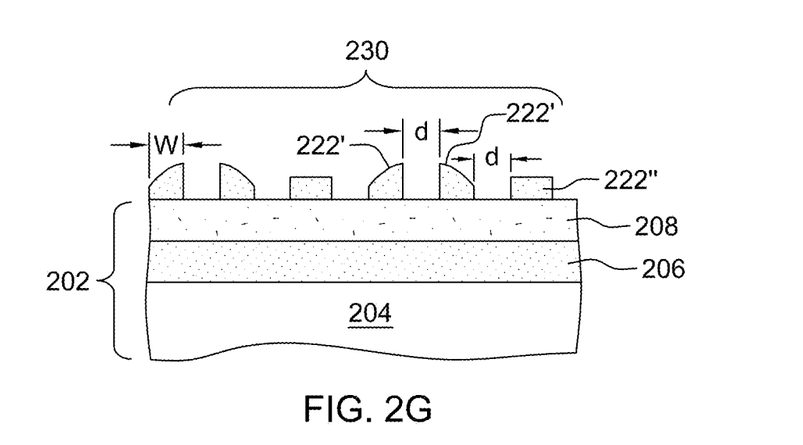
FIG. 2G depicts the mask structure of FIG. 2F after a selective removal of remaining portions of the sacrificial spacing structures, to create mask elements of a desired mask pattern, in accordance with one or more aspects of the present invention.

As depicted in FIG. 2G, one or more etching processes may be performed to selectively remove the remaining portions of sacrificial spacing structures 210' (see FIG. 2F) from the mask structure, leaving sidewall spacers 222' and additional sacrificial spacers 222" as the mask elements of the desired mask pattern 230. Note that sidewall spacers 222' along the sidewalls of sacrificial spacing structures 210' (see FIG. 2F) and additional sacrificial spacers 222", disposed between adjacent sacrificial spacing structures 210', may each have a common width "W", which may (for example) be in the range of about 5 to 30 nanometers. For instance, the common width "W" of sidewall spacers 222' and additional sacrificial spacers 222" may be in the range of about 10 to 20 nanometers. Note also that each pair of sidewall spacers 222' are (in one embodiment) spaced apart a common distance "d" and additional sacrificial spacers 222" are also spaced the same distance "d" from at least one sidewall spacer 222'. In one specific example, the common width "W" may be in a range of about 5 to 30 nanometers and the common distance "d", for instance, may be in the range of about 10 nanometers to 70 nanometers. The selective etch process may be one or more anisotropic, dry-etch processes such as, for example, oxygen strip or plasma etching processing.

One skilled in the art will note that, advantageously, the lithographic processing disclosed herein above enhances the conventional self-aligned double patterning (SADP) adjusting the process to create additional sacrificial spacers 222" between the double pattern elements 222'. This process may be referred to as triple patterning, with the resultant mask being a triple patterned mask. In a further embodiment, the process may be repeated any number of times. For instance, mask pattern 230 could be used as the starting mask structure (with appropriate modification to the substrate structure) to create a 6X, 12X, etc., mask pattern.

Figure 2H:
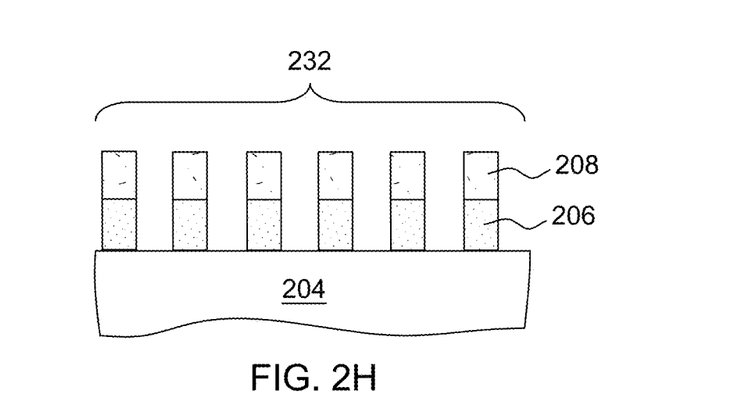
FIG. 2H depicts the resultant structure of FIG. 2G after etching using the mask elements through a portion of the substrate structure to create the desired mask, in accordance with one or more aspects of the present invention.

As depicted in FIG. 2H, in one further implementation, protective substrate layers 206, 208 may subsequently be patterned using mask pattern 230 (see FIG. 2G) to create a patterned etch 232 of the substrate structure. The patterned etch 232 may then be used in patterning the underlying semiconductor substrate, for instance, to facilitate forming one or more fin structures in or extending from semiconductor substrate 204.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a mask structure comprising at least one sacrificial spacing structure disposed above a substrate structure;
   disposing a spacer layer conformally over the mask structure;
   selectively removing the spacer layer, leaving, at least in part, sidewall spacers along sidewalls of the at least one sacrificial spacing structure, and providing at least one additional spacer over the substrate structure, one additional spacer of the at least one additional spacer being other than a sidewall spacer, and disposed in set spaced relation to the at least one sacrificial spacing structure, wherein the selectively removing the spacer layer defines the sidewall spacers and the at least one additional spacer from the spacer layer; and removing the at least one sacrificial spacing structure, leaving the sidewall spacers thereof and the at least one additional spacer over the substrate structure as part of a mask pattern.

2. The method of claim 1, wherein the sidewall spacers are spaced apart a distance "d" and the one additional spacer is spaced the distance "d" from one sidewall spacer of the sidewall spacers.

3. The method of claim 1, wherein the providing includes providing a sacrificial spacing material above the substrate structure, and selectively etching through the sacrificial spacing material to provide the at least one sacrificial spacing structure disposed above the substrate structure, and the selectively etching through the sacrificial spacing material provides a first mask pattern over the sacrificial spacing material, and wherein the first mask pattern is patterned to facilitate providing the at least one additional spacer, including the one additional spacer disposed in set spaced relation to the at least one sacrificial spacing structure.

4. The method of claim 3, wherein the mask structure further comprises an anti-reflective coating layer over the sacrificial spacing material, the anti-reflective coating facilitating providing of the first mask pattern.

5. The method of claim 3, wherein the selectively removing the spacer layer further comprises providing a second mask pattern above the spacer layer, the second mask pattern masking at least one location for the at least one additional spacer, and the selectively removing including using the second mask pattern in providing the at least one additional spacer, at least in part, from the spacer layer.

6. The method of claim 5, wherein the selectively removing the spacer layer further comprises providing an anti-reflective coating above the spacer layer, the anti-reflective coating facilitating providing the second mask pattern.

7. The method of claim 1, wherein the sacrificial spacing material comprises a material selective both to an oxide etching process and a nitride etching process.

8. The method of claim 1, wherein the sacrificial spacing material comprises at least one of amorphous silicon or polysilicon.

9. The method of claim 1, wherein the selectively removing the spacer layer comprises selectively anisotropically etching, at least in part, the spacer layer, the selectively anisotropically etching including removing, at least in part, the spacer layer from between at least one sidewall spacer of the at least one sacrificial spacing structure and the one additional spacer disposed in spaced relation thereto.

10. The method of claim 1, wherein the sidewall spacers and the one additional spacer of the at least one additional spacer each comprise a common width "W" and wherein the sidewall spacers are spaced apart a distance "d", and the one additional spacer is spaced the distance "d" from one sidewall spacer of the sidewall spacers.

11. The method of claim 10, wherein the sidewall spacers and the additional spacer of the at least one additional spacer each have the common width "W" of about 5 to 30 nanometers and wherein the sidewall spacers are spaced apart a distance "d" of about 10 to 70 nanometers and the one additional spacer is spaced the distance "d" of about 10 to 70 nanometers from one sidewall spacer of the sidewall spacers.

12. The method of claim 10, wherein the spacer layer comprises a nitride material.

13. The method of claim 1, wherein the substrate structure comprises a semiconductor substrate with at least one protective substrate layer over the semiconductor substrate, and the mask pattern facilitates patterned etching of the at least one protective substrate layer, the patterned etching facilitating forming fins extending from the semiconductor substrate.

14. The method of claim 13, wherein the semiconductor substrate comprises silicon, the at least one protective substrate layer comprises silicon nitride, and the spacer layer comprises a nitride material.

15. The method of claim 1, wherein the substrate structure comprises a semiconductor substrate with a first protective substrate layer above the semiconductor substrate, and a second protective substrate layer above the first protective substrate layer, and the mask pattern facilitates patterned etching of the first and second protective substrate layers, the patterned etching facilitating forming fins extending from the semiconductor substrate.

16. The method of claim 15, wherein the first protective substrate layer comprises silicon nitride and the second protective substrate layer comprises silicon dioxide.

17. The method of claim 1, wherein the mask structure comprises at least two sacrificial spacing structures disposed above the substrate structure, the at least two sacrificial spacing structures comprising the at least one sacrificial spacing structure, and wherein the selectively removing provides the one additional spacer disposed between two adjacent sacrificial spacing structures of the at least two sacrificial spacing structures.

18. The method of claim 17, wherein the providing comprises laterally spacing apart the two adjacent sacrificial spacing structures a distance which facilitates the providing of the one additional spacer therebetween.

19. The method of claim 18, wherein sidewall spacers of each sacrificial spacing structure of the two adjacent sacrificial spacing structures are spaced apart a distance "d", and the one additional spacer is spaced the distance "d" between two different sidewalls of the two adjacent sacrificial spacing structures.

20. The method of claim 19, wherein the sidewall spacers of the two adjacent sacrificial spacing structures and the one additional sacrificial spacing structure each comprise a common width "W".

* * * * *